(12) United States Patent
Srinivas et al.

(10) Patent No.: US 6,519,745 B1
(45) Date of Patent: Feb. 11, 2003

(54) SYSTEM AND METHOD FOR ESTIMATING CAPACITANCE OF WIRES BASED ON CONGESTION INFORMATION

(75) Inventors: Prasanna Venkat Srinivas, Cupertino, CA (US); Manjit Borah, Cupertino, CA (US); Premal Buch, Cupertino, CA (US)

(73) Assignee: Magma Design Automation, Inc., Cupertino, CA (US)

( * ) Notice: Subject to any disclaimer, the term of this patent is extended or adjusted under 35 U.S.C. 154(b) by 0 days.

(21) Appl. No.: 09/579,966

(22) Filed: May 26, 2000

(51) Int. Cl.[7] .................. G06F 9/45; H03K 19/173; H03K 19/177; G01R 31/26
(52) U.S. Cl. .................. 716/5; 326/38; 326/39; 438/17; 716/2; 716/11; 716/13; 716/6
(58) Field of Search .................. 702/81; 716/1–21; 257/277; 326/36, 39; 327/99; 438/17

(56) References Cited

U.S. PATENT DOCUMENTS

| | | | |
|---|---|---|---|
| 6,185,722 B1 * | 2/2001 | Darden et al. ........... | 716/5 |
| 6,311,139 B1 * | 10/2001 | Kuroda et al. ........... | 702/81 |
| 6,327,693 B1 * | 12/2001 | Cheng et al. ........... | 716/2 |

* cited by examiner

Primary Examiner—Vuthe Siek
Assistant Examiner—Helen Rossoshek
(74) Attorney, Agent, or Firm—Pillsbury Winthrop LLP

(57) ABSTRACT

A system for calculating interconnect wire lateral capacitances in an automated integrated circuit design system subdivides the chip area of a circuit design to be placed and routed into a coarse grid of buckets. An estimate of congestion in each bucket is computed from an estimated amount of routing space available in the bucket and estimated consumption of routing resources by a global router. This congestion score is then used to determine the spacing of the wires in the bucket which is in turn used to estimate the capacitance of the wire segment in the bucket.

8 Claims, 7 Drawing Sheets

SYSTEM AND METHOD FOR ESTIMATING CAPACITANCE OF WIRES BASED ON CONGESTION INFORMATION

BACKGROUND OF THE INVENTION

1. Field of the Invention

The present invention is directed to digital logic design systems. More particularly, the invention is directed to automated digital logic synthesis and placement systems for integrated circuits, and to performance optimization of digital integrated circuits.

2. Background of the Related Art

Prior art computer aided design (CAD) systems for the design of integrated circuits (ICs) and the like assist in the design thereof by providing a user with a set of software tools running on a digital computer. In the prior art, the process of designing an integrated circuit on a typical CAD system is done in several discrete steps using different software tools.

The design process can be broadly divided into two phases. The initial phase 100 (shown in FIG. 1) of selecting the right components and connecting them so that the desired functionality is achieved is called logical synthesis. The second phase 200, in which the selected components are placed within the confines of the chip boundaries and the connecting wires are laid out in order to generate the photographic masks for manufacturing, is called physical synthesis.

First, in the logical synthesis phase 100 a schematic diagram of the integrated circuit is entered interactively in Step 110 to produce a digital representation 115 of the integrated circuit elements and their interconnections. This representation 115 may initially be in a hardware description language such as Verilog or VHDL and then translated into a register transfer level (RTL) description in terms of pre-designed functional blocks, such as memories and registers. This may take the form of a data structure called a net list.

Next, a logic compiler 120 receives the net list in Step 125 and, using a component database 130, puts all of the information necessary for layout, verification and simulation into object files whose formats are optimized specifically for those functions.

Afterwards, in Step 135 a logic verifier 140 preferably checks the schematic for design errors, such as multiple outputs connected together, overloaded signal paths, etc., and generates error indications in Step 145 if any such design problems exist. In many cases, the IC designer improperly connected or improperly placed a physical item within one or more cells. In this case, these errors are flagged to enable her to correct the layout cells in Step 150 so that they perform their proper logical operation.

Also, in Step 135 the verification process preferably checks the cells laid out by hand to determine if multiple design rules have been observed. Design rules may include the timing requirements of the circuit, the area occupied by the final design and parameters derived from other rules dictated by the underlying manufacturing technology. These design rules are provided to integrated circuit designers to ensure that a part can be manufactured with a high degree of yield. Most design rules include hundreds of parameters and, for example, include pitch between metal lines, spacing between diffusion regions in the substrate, sizes of conductive regions to ensure proper contacting without electrical short circuiting, minimum widths of conductive regions, pad sizes, and the like. If a design rules violation is identified in Step 150, this violation is preferably flagged to the IC designer so that she can properly correct the cells so that they are in accordance with the design rules in Step 150.

Then, using a simulator 155 the user of the CAD system may prepare a list of vectors representing real input values to be applied to a simulation model of the integrated circuit in Step 160. This representation may be translated into a form which is better suited to simulation. This representation of the integrated circuit is then operated upon by the simulator which produces numerical outputs analogous to the response of a real circuit with the same inputs applied in Step 165. By viewing the simulation results, the user may then determine in Step 170 if the represented circuit will perform correctly when it is constructed. If not, she may re-edit the schematic of the integrated circuit, re-compile it and re-simulate it in Step 150. This process is performed iteratively until the user is satisfied that the design of the integrated circuit is correct.

Then, the human IC designer may present as input to a logic synthesis tool 175 a cell library 180 and a behavioral circuit model. The behavioral circuit model is typically a file in memory which looks very similar to a computer program, and the model contains instructions which logically define the operation of the integrated circuit. The logic synthesis tool 175 maps the instructions from the behavioral circuit model to one or more logic cells from the library 180 to transform the behavioral circuit model to a gate schematic net list 185 of interconnected cells in Step 187. The gate schematic net list 185 is a database having interconnected logic cells which perform a logical function in accordance with the behavioral circuit model instructions. Once the gate schematic net list 185 is formed, it is provided to a place and route tool 205 to begin the second phase of the design process, physical synthesis.

The place and route tool 205 is preferably then used to access the gate schematic net list 185 and the library cells 180 to position the cells of the gate schematic net list 185 in a two-dimensional format within a surface area of an integrated circuit die perimeter. The output of the place and route step may be a two-dimensional physical design file 210 which indicates the layout interconnection and two-dimensional IC physical arrangements of all gates/cells within the gate schematic net list 185. From this, in Step 215 the design automation software can create a set of photographic masks 220 to be used in the manufacture of the IC.

One common goal in chip design involves timing performance. The timing performance of the chip is determined by the time required for signals to propagate from one register to another. Clock signals driven at a certain frequency control storage of data in the registers. The time required for a signal to propagate from one register to another depends on the number of levels of cells through which the signal has to propagate, the delay through each of the cells and the delay through the wires connecting these cells. The logic synthesis phase 100 influences the number of levels and the propagation delay through each cell because in it the appropriate components are selected, while the physical synthesis 200 phase affects the propagation delay through the wires.

During the process of timing optimization during physical design in Step 205, circuit timing is evaluated based on an initial placement and selection of cell strengths. The feedback from the timing analysis is used to drive repeated improvements to the placement software and the selection of the strengths of the cells. The automation software may also perform buffering on some parts of the circuit to optimize the timing performance by inserting repeater cells, i.e., buffers, to speed up certain paths. Preferably, the optimization software tentatively applies one such modification, evaluates the timing and other constraints (such as design rules dictating capacitance limits) to determine if the step is acceptable and then makes the change permanent if it is deemed acceptable.

The interconnection of the cells in the placing and routing of Step 205 generally involves interconnect wiring having between two and seven metal layers. The delay through an interconnect wire depends on the capacitance of the wire, its resistance and, to a lesser extent, the inductance of the wires. The capacitance of a wire 510 (see FIG. 9) consists mainly of the capacitance $C_a$ due to the overlap of the wire with the layer 520 above or below, called the area capacitance $C_a$, and the capacitance due to the overlap along the side walls with other signal wires 530 and 540 adjacent to it, called the lateral capacitance $C_L = C_{12} + C_{13}$. The capacitance of a given wire such as wire 510 can be calculated on a case-by-case basis as is known in the art, and will primarily depend on the wire dimensions $D_W$ and $D_T$ as well as the distance $D_L$ of the wire 510 from the other layers 520 and the distance $D_{12}$ and $D_{23}$ of the wire 510 from the other wires 530 and 540. In deep sub-micron manufacturing technologies the widths of the wires are becoming thinner and thinner, making them tall and narrow. As a result, under current development trends the lateral capacitance $C_L$ is becoming a dominant component of the total wire capacitance.

During the process of timing optimization during physical design, circuit timing is evaluated based on an initial placement and selection of cell strengths. The feedback from the timing analysis is used to drive the repeated improvements to the placement software and the selection of the strengths of the cells. Since physically laying out all the wires without violating design rules and maintaining good delays is a very time consuming step, a Steiner tree-based topology is used to estimate the area and delay due to the wires based on the current cell placement.

An Elmore delay model is commonly used to compute the wire delay based on the Steiner tree-based topology. However, computing the capacitance of the wires based on the Steiner tree topology is difficult, because nothing is known about the spacing of the wires and the adjacency of different signals at this point in design. Existing approaches use the worst case scenario, and assume that there are wires adjacent to the signal wire in consideration and thus tend to over-estimate the capacitance. Since the optimization software depends on the feedback from the timing analysis, accurate estimation of the capacitance is crucial to the success of the optimizations.

SUMMARY OF THE INVENTION

In view of the above problems of the prior art, it is an object of the present invention to provide a method of estimating the effect of adjacent wires on the capacitance of a signal wire in a circuit design which provides estimates superior to prior art techniques.

It is another object of the present invention to provide a method of estimating the effect of adjacent wires on the capacitance of a signal wire in a circuit design which provides estimates for better than worst case scenarios.

One of the indicators for the expected spacing of the wires in the final routed circuit is the density of the interconnect wires at a given point, i.e., the wires' congestion. The greater the number of wires that passes through a given bucket, the greater the density of wires in that bucket will be and as a result the spacing tends to be smaller to fit all the wires. It would be advantageous to make use of the congestion in a circuit to derive an early estimate of the capacitance.

Thus, it is yet another object of the present invention to provide a method of estimating the effect of adjacent wires on the capacitance of a signal wire in a circuit design which provides estimates based on an estimate of congestion in the design.

The above objects are achieved according to an aspect of the invention by subdividing the chip area of a circuit design to be placed and routed into a coarse grid of buckets. An estimate of congestion in each bucket is computed from an estimated amount of routing space available in the bucket and estimated consumption of routing resources by a global router. This congestion score is then used to determine the spacing of the wires in the bucket which is in turn used to estimate the capacitance of the wire segment in the bucket.

BRIEF DESCRIPTION OF THE DRAWINGS

These and other objects, features and advantages of the present invention are better understood by reading the following detailed description of the preferred embodiment, taken in conjunction with the accompanying drawings, in which.

DETAILED DESCRIPTION OF PRESENTLY PREFERRED EXEMPLARY EMBODIMENTS

Figure 1:
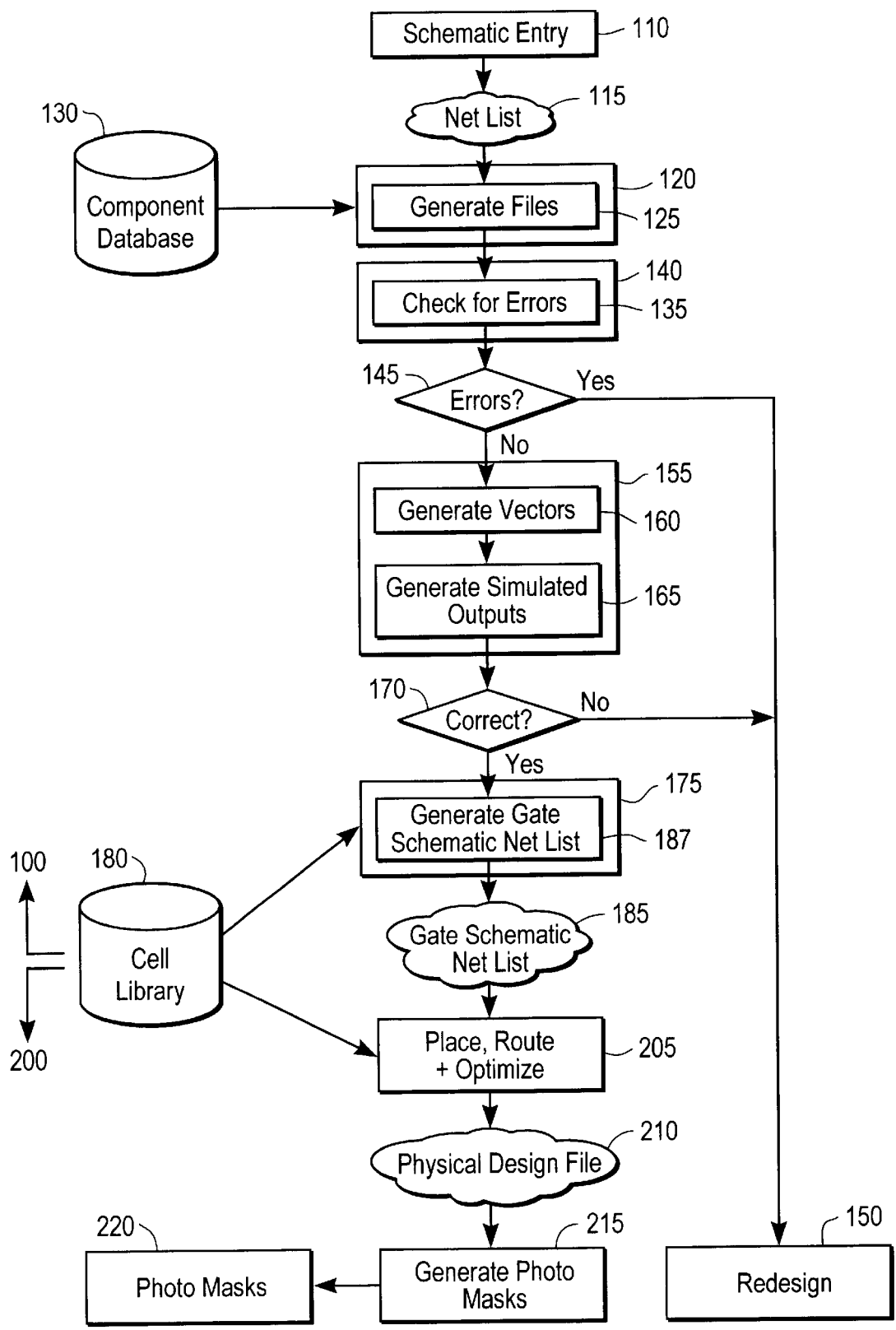
FIG. 1 is a flowchart of an integrated circuit design process according to the prior art.

In one model, the delay through a single logic gate can be represented as $$d = g \cdot h + p \qquad (1)$$

where d is the delay, g is a parameter called the "logical effort" of the gate, h is a parameter called the "electrical effort" of the gate, and p is the parasitic or fixed part of the delay g, in turn, is defined by $$g_{gate} = \frac{R_{gate\_min} C_{Gate\_min}}{R_{inv\_min} C_{inv\_min}} \qquad (2)$$

where gate_min refers to a minimum-sized gate and inv_min to a minimum-sized inverter. h, in turn, is defined by $$h = \frac{c_{out}}{c_{in}} \quad (3)$$

where $c_{out}$ is the capacitance out of the gate and $c_{in}$ is the capacitance into the gate.

In a constant delay approach to cell placement, the pin-to-pin delay of each cell is fixed early on in the optimization flow. This delay is maintained independently of the load a cell drives. In order to keep delay constant, the size of the cell is adjusted according to the load that it drives. As a result, the area of each cell in the design varies with the load that it drives. The area of each cell is $$a = b + s \cdot c_{out} \quad (4)$$

where b and s are constants related to the logic of the cell and the chosen constant delay for the cell. Thus, the total area of the netlist is, in matrix notation for plural gates, $$A = B + SC \quad (5)$$

Approximating the input load at each pin of the cell by $c_k/h_k$, the total load at the output of a cell i is $$c_i = \frac{c_j}{g_j} + \frac{c_k}{g_k} \ldots + d_i \quad (6)$$

or, alternatively, $$c_i = \sum_{fanout} \frac{c_k}{h_k} + d_i \quad (7)$$

where $d_i$ is the wire load. That is, the total load at the output of cell i is the sum of all its fanout loads plus the load of the wire connecting the cell to its fanouts. In matrix notation for plural gates, $$C = HC + D \quad (8)$$

$$(I - H)C = D \quad (9)$$

Setting $G = I - H$, $$GC = D \quad (10)$$

$$C = G^{-1}D \quad (11)$$

where C is the output capacitance of all gates in the circuit and D is the wire load. Thus, according to the last equation above, the output load of the cells in the circuit can be found once the placement is known. Then, the size of each cell can be found to keep its delay constant. The area of each cell in the netlist denoted by A is $$A = K_1 + K_2^T C \quad (12)$$

and substituting Equation (10) gives $$A = K_1 + K_2^T G^{-1} D \quad (13)$$

Since the load of each wire can be represented as $d = u \cdot l$, where d is the wire load, u is the load per unit length of wire and 1 is the total length of the wire, $$A = K_1 + \mu K_2^T G^{-1} L \quad (14)$$

and combining constant terms, $$A = K_1 + WL \quad (15)$$

Thus, in order to minimize the circuit area one can minimize WL, where the matrix W may be viewed as a set of weights of the wire lengths L.

Generally, the cell is modeled as a rectangle, with the height of the rectangle being the height of a standard cell row. Thus, the width and therefore the area of the cell are functions of the load.

The preferred embodiment of the present invention processes a data structure representative of the circuit being placed and routed. Preferably, this is done on a digital computer as is known in the art. The data structure may be a netlist or other suitable structure known in the art; however, it is preferably a data model of the type disclosed in the U.S. patent application Ser. No. 09/300,540 to Van Ginneken et al; however, other simpler structures may be used as well.

Figure 2:
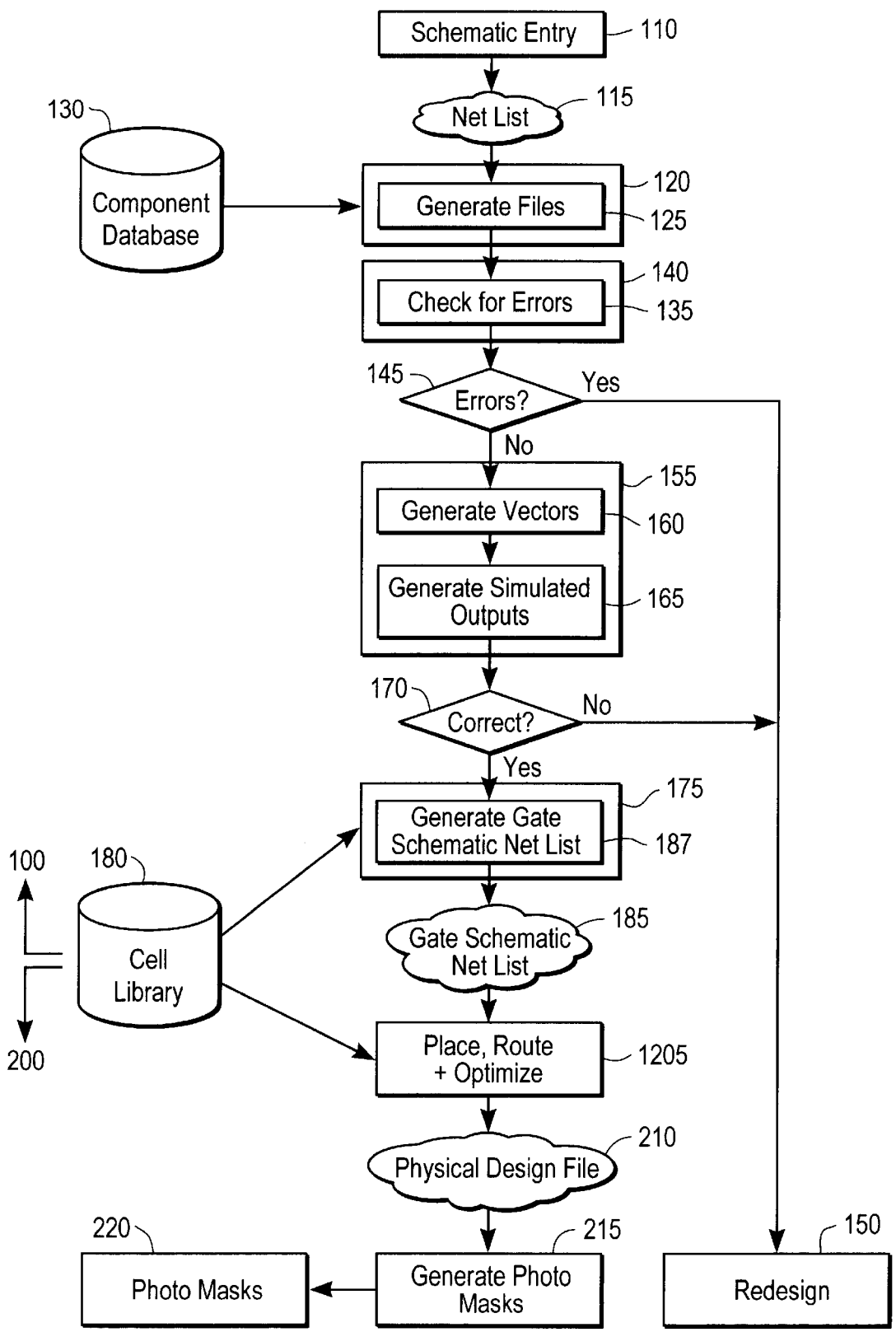
FIG. 2 is a flowchart of an integrated circuit design process according to a preferred embodiment of the present invention.
Figure 3:
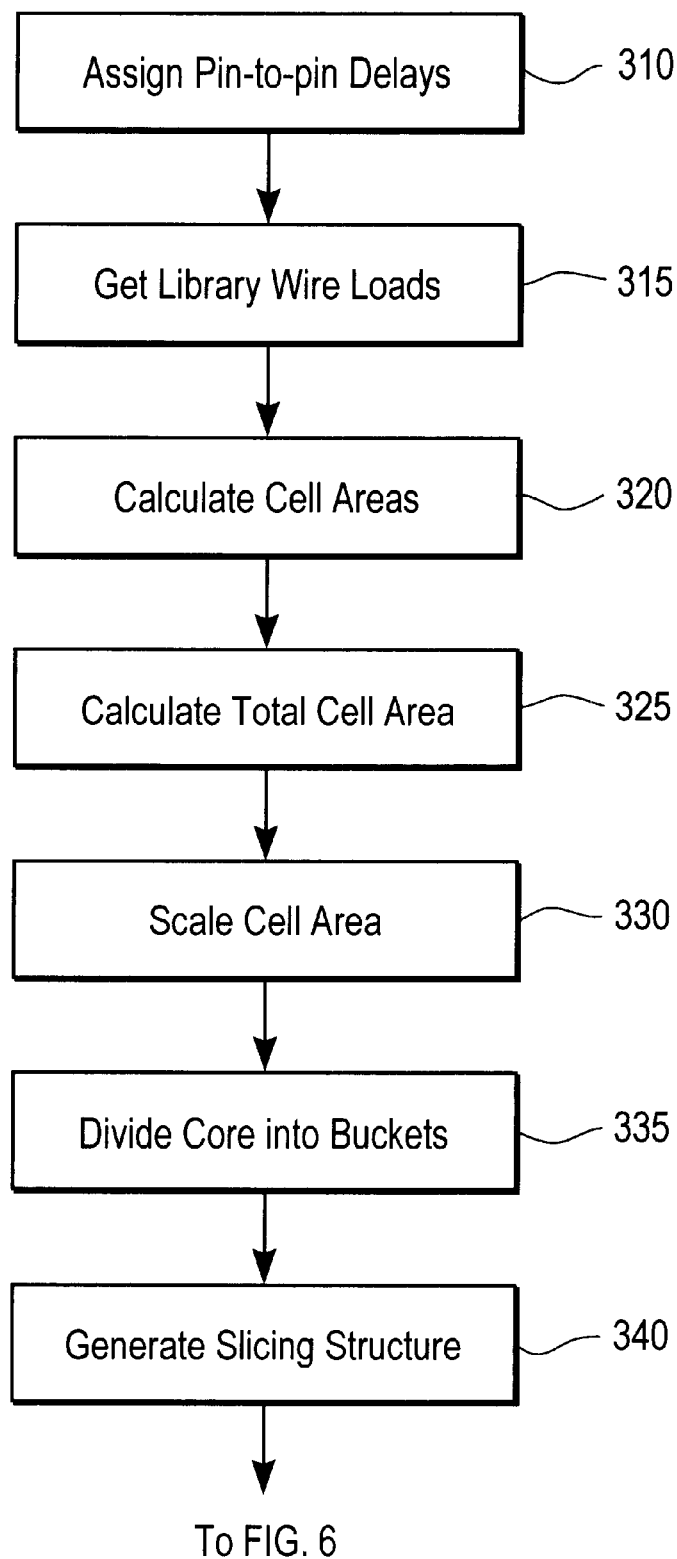
FIGS. 3 and 6 are a flowchart showing a place and route process according to the preferred embodiment.
Figure 6:
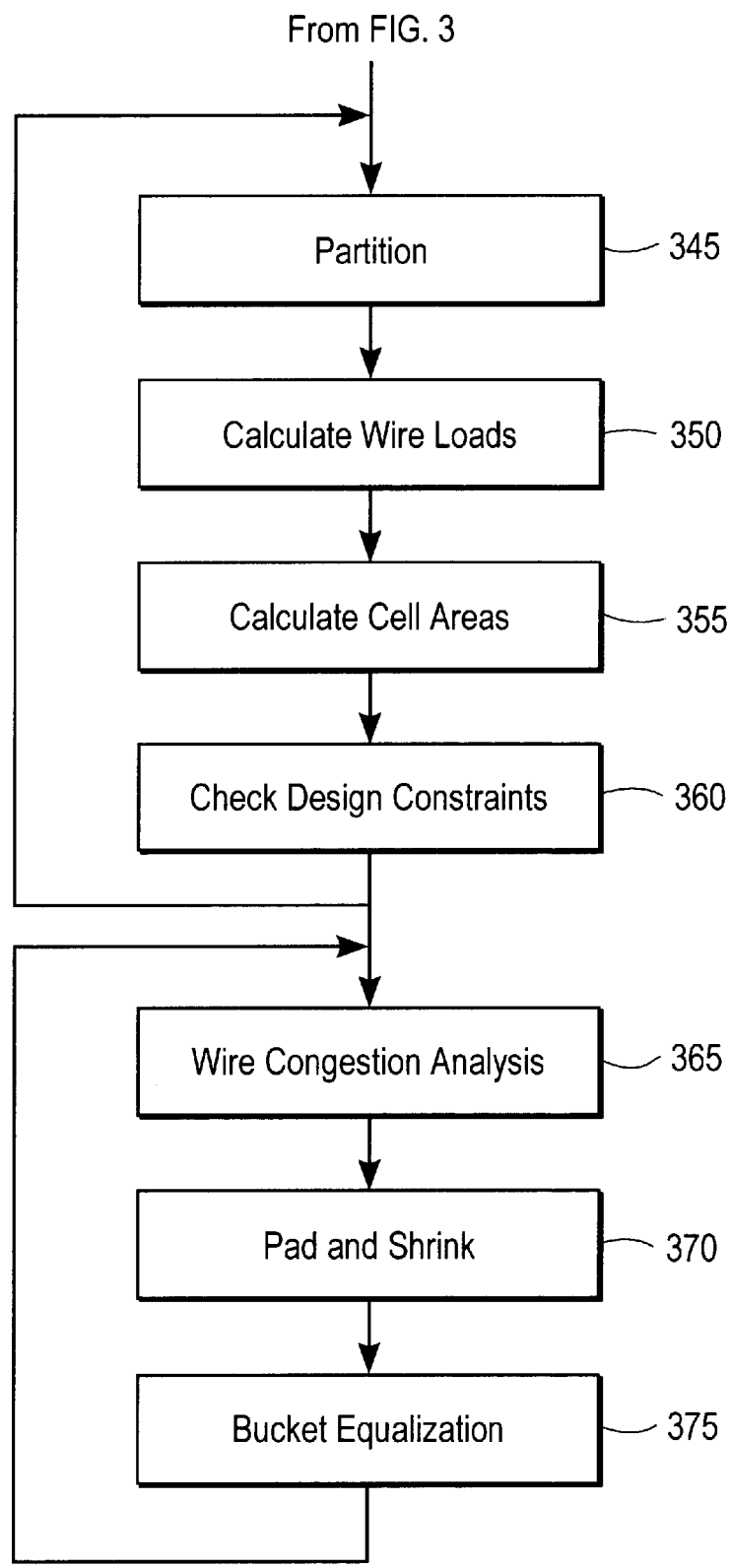

The overall flow of a place and route process 1205 (see FIG. 2) according to a preferred embodiment of the present invention is shown in FIGS. 3 and 6. Since a design constraint of the placement process is that the delay across a net be constant, in the preferred embodiment the area of a cell is dependent on the load it drives. In turn, the load of a wire is not known with certainty until the placement process is finished. Thus, to make an initial placement of cells within the core some initial estimations are preferably made. Each cell is assigned a pin-to-pin constant delay in Step 310. Appropriate techniques will be readily apparent to those skilled in the art; however, pin delay assignment is preferably done according to the technique described in the U.S. patent application Ser. No. 09/300,666. Throughout the placement process, this delay will be maintained constant and the area of the cell varied according to the load it drives in order to achieve the assigned delay.

To make the initial cell placement, the area of each cell is calculated in Step 320 using wire loads obtained from the cell library in Step 315 and substituted into Equation 15. Although cells of varying power levels are available only in discrete steps in the target cell library, this phase of the technique proceeds as if a continuous spectrum of cell power levels are available and selects a cell from the library closest to the size ultimately selected as one of the final steps of the process.

The total cell area $A_{total}$ is determined by adding up the areas of all the cells in Step 325, and the sizes of the cells are scaled to achieve a target percentage of core utilization in Step 330. Based on this, standard cell rows are created.

Figure 4:
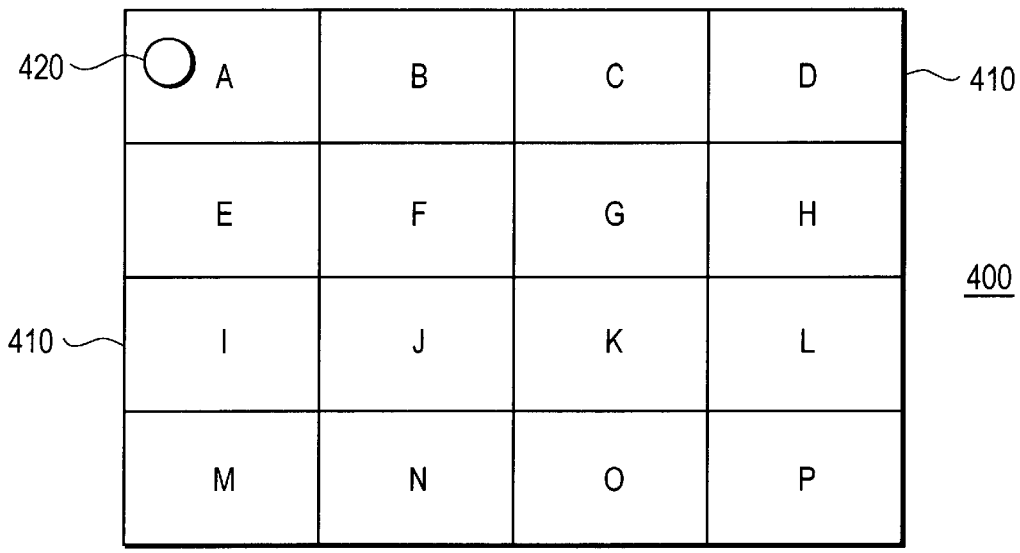
FIG. 4 shows a coarse grid with buckets in a circuit used with the preferred embodiment.
Figure 5:
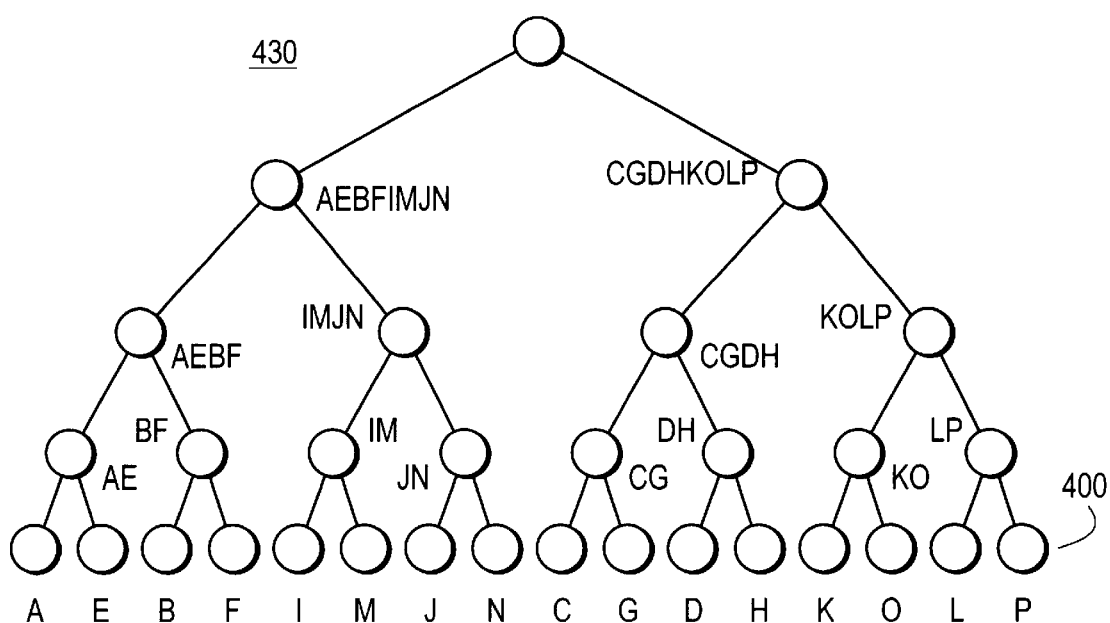
FIG. 5 shows a slicing structure used in the preferred embodiment.

More specifically, the core 400 where the cells are placed is divided into coarse placement regions called buckets 410 as shown in FIG. 4. Each bucket 410 is a small rectangular region within the core 400. Buckets 410 have equal dimensions but the placeable area within a bucket 410 depends on the presence of blockages such as macros in the bucket 410. A bucket 410 can accommodate about fifty average-sized standard cells 420. Then, in Step 340 a slicing structure or binary tree 430 is built whose leaves 440 are the coarse buckets 410. For example, a core 400 having a 4×4 matrix of buckets 410 imposed thereon (of course, in practice there will be a much greater number of buckets 410) as shown in FIG. 4 can be represented by the slicing structure 430 shown in FIG. 5.

Cells 420 are assigned to the buckets 410 so that the total area of cells 420 within each bucket 410 closely matches the area of that bucket 410. This is done by an iterative bipartitioning of the data model. First, a horizontal or vertical cut of the core 400 is chosen. The total area available on each side of the partition is computed. Cells 420 are divided using quadratic placement (see below) and a mincut technique (see, e.g., Fiduccia et al., "A Linear Time Heuristic for Improving Network Partitions", ACM/IEEE Design Automation Conference, 1982, pp. 175–81) on each side so that total wire length is minimized. This iteration continues until a desired resolution, e.g., a bucket 410, is reached.

Later, each cell 420 is assigned to one of the buckets 410 using a partitioning technique in Step 345 as shown in FIG. 6. The second placement is done instead of a single cell-level placement because the first placement is done with a coarse grid, i.e., buckets containing hundreds of cells. Here, the cells are placed into their corresponding buckets. In the later stage when other optimizations such as choosing the size and adding repeaters are done and the netlist is more stable, the second, detailed placement is done. This placement step places a cell in its actual location. In this stage, some cells may move from their originally-assigned bucket to a neighboring bucket to make room for the cells in a highly populated bucket in order to reduce congestion.

A good placement of cells 420 is one that can be easily routed and satisfies the given timing constraints for the logic circuit. Quadratic placement, and in particular Gordian quadratic placement, finds a legal placement while minimizing the total squared wire length in the circuit and is the placement technique preferably used. Gordian quadratic placement is well-known in the art as shown by, e.g., Klienhans et al., "GORDIAN: VLSI Placement by Quadratic Programming and Slicing Optimization", IEEE Trans on Computer-Aided Design, v. 10, n. 3 (Mar. 1991), pp. 356–365, and for simplicity will be generally described below.

The problem is independently solved for the x and y coordinates. Briefly describing the process for the x coordinates (the process for the y coordinates is similar), quadratic placement solves the following equation subject to a constraint Hx=t (to account for physical realities such as overlapping cells and the like) to minimize total wire length during placement:

$$\tfrac{1}{2}(\Sigma \alpha_{ij}(x_i - x_j)^2 + \Sigma \alpha_{ij}(x_i - b_j)^2) \quad (16)$$

$$\tfrac{1}{2} x^t A x - x^t d + \text{constant} \quad (17)$$

x is the location of cells 420 and star nets. Star nets are nets with more than fifteen pins. A star net is treated like a cell 420. All cells 420 attached to a star net are considered to be attached to the center of the net through a two-pin net. Star nets are used to reduce the number of fill-ins in the matrix A. The weight of a net $k_i$ is 2/(number of pins). The weight of a net connecting a cell 420 to the center of a star net is 1.b has the locations of fixed points. Fixed points are pins of pads or macros. The diagonal elements of A are non-zero and are computed as follows:

$$a_{ij} = \text{SUM} k_l \quad (18)$$

Any cell 420 connecting to cell ii through a non-star net and a star net connecting to a cell i contribute to the summation. The element $a_{ij}$ is non-zero if cells i and j are connected through a net.

$$a_{ij} = -\text{SUM } k_i \quad (19)$$

The contribution comes from the nets connecting cells i and j.

$$d_i = \text{SUM } b_j k_i \quad (20)$$

The contribution comes from all constant pins attached to cell i. The x coordinates for a placement that minimizes the total wire length is obtained by solving $$Ax = d \quad (21)$$

The initial constraints for quadratic placement assumes the center of mass for all cells 420 on the chip is the center of the chip. If the area of each cell is $a_i$, $\Sigma a_i x_i = X_{center}$ forms the first constraints for quadratic placement.

The place and route software then performs global routing on the placed cells 420. Global routing is a coarse level routing that uses Steiner tree-based topologies to connect the bucket centers. The use of Steiner trees in such contexts is well-known in the art; see, for example, Borah et al., "An Edge-Based Heuristic for Steiner Routing", IEEE Transactions on Circuits and Systems 1563–68 (1993) and Griffith et al., "Closing the Gap: Near-Optimal Steiner Trees in Polynomial Time", IEE Transactions on Computer-Aided Design of Integrated Circuits and Systems, v. 13,n. 11 (Nov. 1994) 1351–65 (both incorporated herein by reference) and will not be described in greater detail herein.

When the global routing software adds a wire through a bucket (either during the initial Steiner tree calculation or during recalculations as described below), the budget for the appropriate layer is adjusted to reflect the use of one routing resource from the bucket. More specifically, in order to concisely describe congestion in a bucket, the available routing space in each routing layer is estimated in advance by the computer and assigned to the bucket as a budget for that layer. Every time a wire is routed through the bucket in a particular routing layer, the budget for that layer is adjusted to reflect that one routing space has been spent. The lower the number of available spaces, the greater the congestion in the bucket in the given routing layer.

Figure 7:
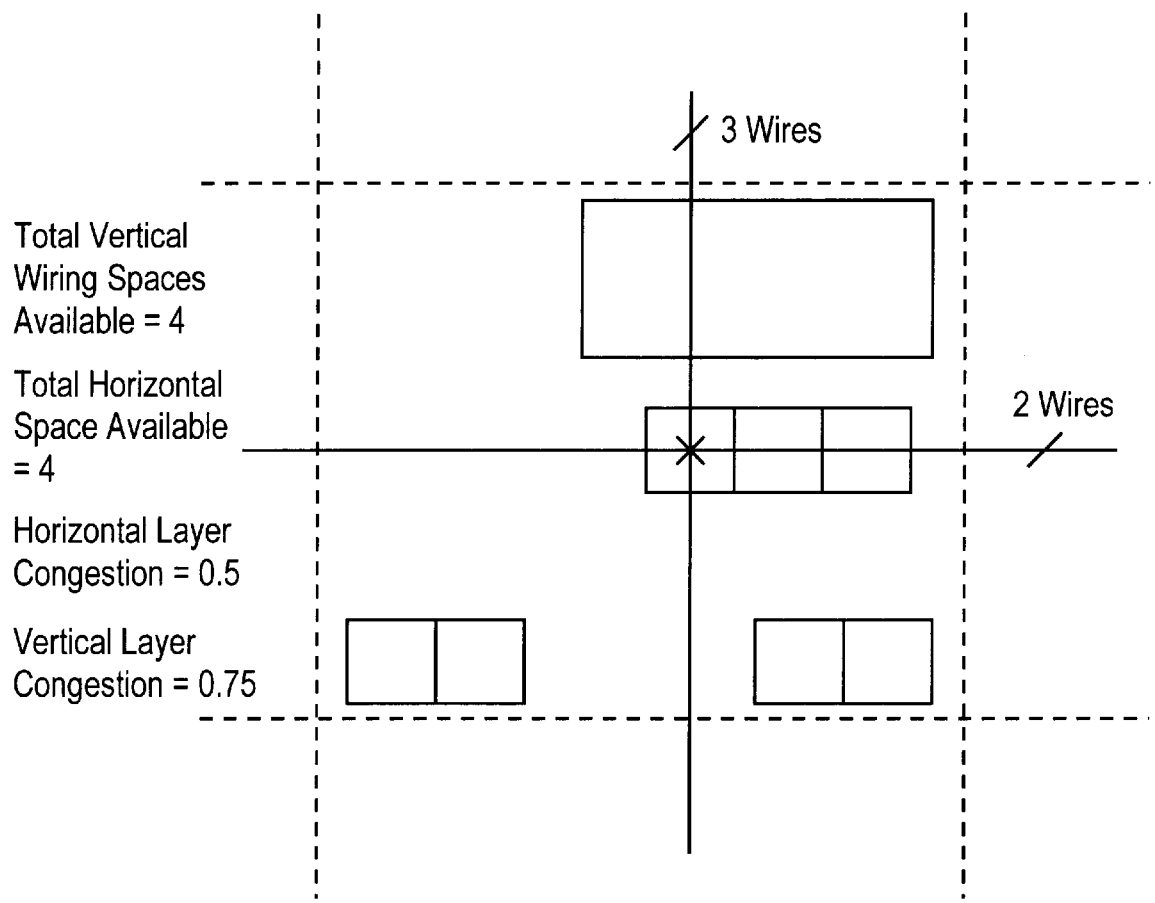
FIG. 7 shows a cell upon which congestion calculations are performed according to the preferred embodiment.

FIG. 7 illustrates an example of a bucket with three routing wires running through it in the vertical direction in one layer and two routing wires running through it in the horizontal direction in another layer. The congestion score for a bucket is defined as the ratio of the routing resources used so far to the total routing resources available in the bucket. For example, the vertical layer of the bucket of FIG. 7 has a total of four routing spaces (its actual dimensions will be larger than this due to design rule considerations as described in greater detail below), and three vertical wires are going through the bucket. Thus, this bucket has a congestion score of 0.75 along the layer in the vertical routing direction. Similarly, the horizontal routing direction has 2 wires going through it, resulting in a congestion score of 0.5.

When the capacitance for a wire is estimated, e.g., during optimization operations such as inserting repeaters, choosing appropriate strengths, etc., the congestion score for each of the buckets the wire goes through is used to compute the spacing for the wire segment in the bucket. To calculate the congestion score for a bucket, it is important to remember that design rules require a certain amount of free space on each side of a routing wire. Thus, a layer having spaces to accommodate ten routing wires which has five routed therethrough (wire-space-wire-space . . . ) may have 100% congestion because the layer cannot accommodate any more routine wires while maintaining the separation design rule.

Given the above, one can see that a layer having 50% congestion can roughly be thought of as having a number of routing wires with one empty space on one side and two empty spaces on the other—omitting the required space on each side of the wire, it has one wire for two usable spaces). A layer having 33% congestion can similarly be thought of as having routing wires with one space on one side and three spaces on the other, or with two spaces on one side and two spaces on the other (one wire in three usable spaces). A layer having 25% congestion can be thought of as having routing wires with two spaces on one side and three spaces on the other (one wire in four usable spaces). Further discrete points can be derived with more sparse routing layers.

Given a maximum of three spaces between adjacent wires in a routing layer, a suitable equivalence chart might be:

| Congestion Score | Corresponds to |
|---|---|
| 0–23% | 3 spaces/3 spaces |
| 23–29% | 2 spaces/3 spaces |
| 29–42% | 2 spaces/2 spaces or 1 space/3 spaces |
| 42–75% | 1 space/2 spaces |
| 75–100% | 1 space/1 space |

In a variation on the preferred embodiment the spacing value for the wires are rounded to the nearest integers and a congestion score of more than 75% is considered to have a spacing of 1 on both sides (the minimum spacing which could conform to the design rules), a congestion score of 50% represents a spacing of 1 on one side and 2 on the other side and a score below 50% uses spacing of 2 on both sides. Hence if the initial number of routable spaces available in a bucket is 10 and we have routed three wires through it then the congestion score for the bucket is 30%. Each wire running through this bucket will be assumed to have a spacing of 2 on both sides.

The interconnect wire capacitance determination makes use of the spacing thus computed to compute the lateral capacitance for the wire segment. As is known in the art, this can be done by taking a number of parameters of the technology into account; for example, design rule spacings, distance of the routing layer from the substrate, thickness and material of the wires and the like. Generally speaking, the most important factors are the width and spacing of the wires.

The capacitance of the whole net is then computed by adding up the contribution of each wire segment belonging to the net. It may then be used where needed in optimization operations, e.g., inserting repeaters, choosing appropriate strengths, etc.

Based on the routed cell arrangement resulting from the initial Steiner tree arrangement, the cell areas can be recalculated in Step 355 using Equation 15 with the new wire loads substituted therein. At this point, the cell placement will likely be somewhat unbalanced. This imbalance may take several forms:

- widely varying cell utilization percentages—for example, if the core utilization before the cell area recalculation is 90%, after recalculation some buckets 410 will have higher utilization percentages and some buckets 410 will have lower utilization percentages. This is undesirable because, for example, overutilized buckets 410 may present obstacles to wire routing or usage of pads.
- cell recalculation enlarges the size of some cells 420 so that they do not fit within their buckets 410, or so that they overlap other cells 420.
- cell recalculation results in too much wasted area, i.e., unutilized core area.

To correct these problems, an iterative procedure is used. First, the current layout is checked to see if it meets given utilization constraints such as core utilization percentage in Step 360. If so, the placement procedure is complete and this part of the routine ends. If not, i.e., if the total area $A_{total}$ of the cells 420 does not fit in the core 400 within the given predetermined utilization constraints, the procedure returns to Step 345 where repartitioning is conducted by coarse placement based on the last-determined cell areas from Step 350, and the repartition-recalculation-checking loop is iteratively executed again based on the newly-calculated cell areas and wire loads to further converge toward an acceptable placement.

Additional analysis shows that it is always possible to find a floorplan where the total area of the cells 420 matches the core area. Consider a coarse placement where each cell 420 has a location (xi, yi) and an area based on the load it drives as outlined above. From Equation 14 above, the total area of the design is $$A_{Cell} = K_1 + WL \tag{22}$$

Now, assume both x and y directions are stretched by a factor of $\alpha$. The length of each wire is increased by $\alpha$, and since the cell area is linearly dependent on the wire length, $$A_{Scaled\ Cell} = \alpha(K_1 + WL) \tag{23}$$

However, by scaling the core 400 by a factor of $\alpha$ its area will increase quadratically:

$$A_{Scaled\ Core} = \alpha^2 A_{Core} \tag{24}$$

Since the core area increases more rapidly that the cell area as they are scaled, at some point the core area will be equal to and then exceed the cell area. This point can be found by setting the scaled core area equal to the total scaled cell area and solving for $\alpha$:

$$\alpha^2 A_{Core} = \alpha(K_1 + WL) \tag{25}$$

$$\alpha = \frac{B + WL}{A_{Core}} \tag{26}$$

This is the factor by which the core 400 must be enlarged to accommodate the total cell area.

After a satisfactory placement has been found in Step 560, the cell area in individual buckets 410 is balanced to balance routing resource usage and area usage among all buckets 410. First, a global router assigns routes to all nets in Step 365 and an analysis of routing resources on the core 400 determines congested areas. In Step 370, cells 420 in the most congested areas are "padded" by arbitrarily increasing their areas slightly, and cells 420 in the most underutilized areas are "shrunk" by arbitrarily reducing their areas slightly. This tends to increase the rate at which cells 420 migrate from overutilized areas to underutilized areas.

Next, a bucket equalization process is applied to the cells 420 to move cells 420 from overutilized buckets 410 to underutilized ones in Step 375. This is a sort of "bucket brigade" movement in which a cell 420 moves at most from one bucket 410 to an adjacent bucket 410. For example, in a series of ten consecutively numbered buckets 410 on a horizontal path, if cells 420 need to be moved from bucket 1 to bucket 10, some cells 420 are moved from bucket 1 to bucket 2; some from bucket 2 to bucket 3, etc. As cells 420 move from one bucket 410 to another, the loads of nets attached to them change. This causes a corresponding change in the area of other cells 420 in the design, and these are corrected locally rather than through a global recalculation process. To ensure that changes to cell areas are minimized, cell movements along many different paths are examined and only the best used.

Figure 8:
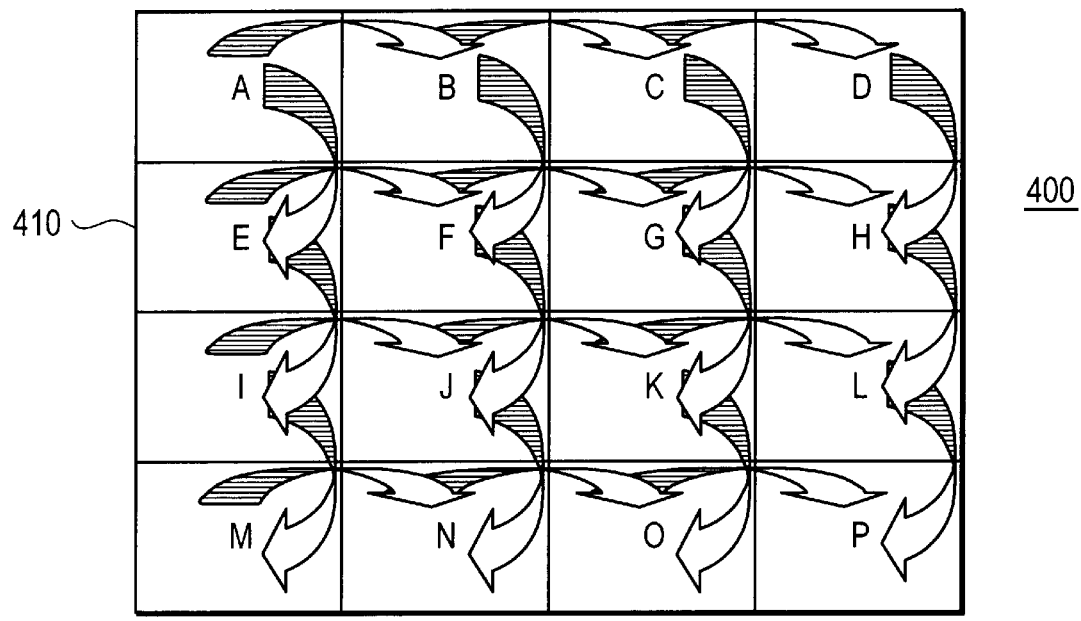
FIG. 8 shows a bucket mincut process according to the preferred embodiment.
Figure 9:
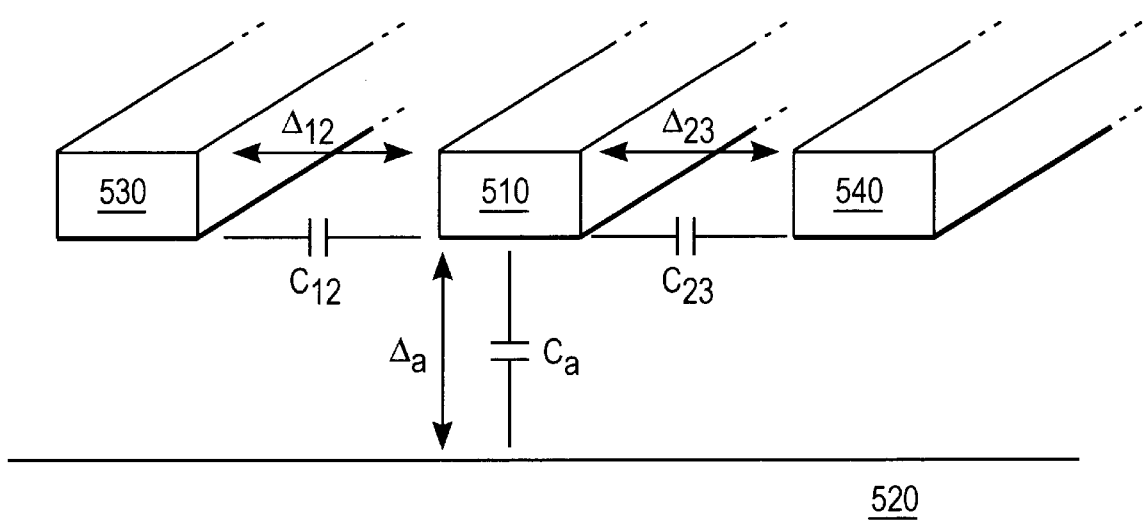
FIG. 9 shows the major components in routing wire capacitance.

Finally, in the pairwise refinement process of Step 380, a mincut process is applied between adjacent buckets 410 in a sweeping fashion as shown in FIG. 8. Starting from the topmost corner of core 400, each bucket 410 and its immediate neighbors to the right and bottom are repartitioned in order to reduce the number of crossing nets. One full pass of the repartitioning ends when the bottom rightmost bucket 410 is reached. At this point, the total wire length in the circuit is computed in Step 385 and the areas of all cells 420 are readjusted in Step 390. If there is an improvement in wire length, another iteration through the process is begun at Step 365; if not, this part of the process is complete.

After the strengths of the cells 420 are optimized based on the timing analysis using the global routing topologies, track routing is performed which assigns a specific routing space in the bucket 410 to each wire. The final stage of physical routing software puts the physical wires following the space assignment made by the track routing as closely as possible and completes the connections for all the cells.

The present invention has been described above in connection with a preferred embodiment thereof; however, this has been done for purposes of illustration only, and the invention is not so limited. Indeed, variations of the invention will be readily apparent to those skilled in the art and also fall within the scope of the invention.

For example, the embodiment has been described in connection with a discrete integer spacing architecture; however, the invention is not so limited and may be used with fractional or other non-integer systems as well. Further, although in the preferred embodiment a maximum spacing of three was used, higher-order spacings may be used as well.

What is claimed is:

1. A method of estimating capacitance of interconnect wires in an integrated circuit chip design, the method comprising:

grouping a plurality of cells in the design into a plurality of buckets;

maintaining a congestion score for each bucket;

when routing a wire through a bucket, modifying the congestion score accordingly; and using the congestion score to calculate an estimated capacitance for the wire.

2. The method of claim 1, wherein the congestion score is a ratio of a number of available wire routing spaces in a given layer of the bucket in a given direction to a total number of wire routing spaces in the given layer of the bucket in the given direction.

3. The method of claim 1, wherein maintaining the congestion score for each bucket includes excluding a wire routing space required to be empty in order to meet design rules from consideration as an available wire routing space.

4. The method of claim 1, wherein using the congestion score to calculate an estimated capacitance for the wire includes estimating a spacing on at least one side of wires in a bucket based on that bucket's congestion score.

5. The method of claim 4, wherein using the congestion score to calculate an estimated capacitance for the wire includes estimating a spacing on both sides of wires in the bucket based on that bucket's congestion score.

6. The method of claim 4, wherein a range of congestion scores is equivalent to a given spacing configuration for wires in the bucket.

7. The method of claim 1, wherein using the congestion score to calculate an estimated capacitance for the wire includes adding together a plurality of estimated capacitances for segments of the wire in different buckets.

8. The method of claim 1, wherein the calculated estimated capacitance includes a lateral capacitance component.

* * * * *